US007201251B1

(12) United States Patent
Baird

(10) Patent No.: US 7,201,251 B1
(45) Date of Patent: Apr. 10, 2007

(54) MODULAR SPEAKER CABINET

(76) Inventor: Derrick Lynn Baird, 1526 Carrie Belle Dr., Knoxville, TN (US) 37912

( * ) Notice: Subject to any disclaimer, the term of this patent is extended or adjusted under 35 U.S.C. 154(b) by 402 days.

(21) Appl. No.: 10/614,385

(22) Filed: Jul. 7, 2003

Related U.S. Application Data

(60) Provisional application No. 60/395,224, filed on Jul. 11, 2002.

(51) Int. Cl.

| | |
|---|---|
| ***H05K 5/02*** | (2006.01) |
| ***H04R 1/02*** | (2006.01) |
| *H05K 7/10* | (2006.01) |
| *A47B 81/06* | (2006.01) |

(52) U.S. Cl. ...................... 181/145; 181/199; 381/182; 381/386; 381/335

(58) Field of Classification Search ................ 181/145, 181/148, 199; 381/345, 350, 351, 182, 386, 381/388, 333–335; D14/204
See application file for complete search history.

(56) References Cited

U.S. PATENT DOCUMENTS 2,464,422 A * 3/1949 Venditty ..................... 411/554
2,632,055 A * 3/1953 Parker ......................... 381/335
2,995,793 A * 8/1961 Griffiths et al. ............. 411/349
3,220,078 A * 11/1965 Preziosi ....................... 411/349
4,805,730 A * 2/1989 O'Neill et al. .............. 181/148
4,932,060 A * 6/1990 Schreiber ..................... 381/300
4,940,108 A * 7/1990 Selby ......................... 181/145
5,000,286 A * 3/1991 Crawford et al. ........... 181/145
5,297,851 A * 3/1994 Van Hekken .......... 297/452.14
5,445,483 A * 8/1995 Fultz .......................... 411/181
5,714,723 A * 2/1998 Kang .......................... 181/199
5,758,852 A * 6/1998 Martin ..................... 248/282.1
5,779,354 A * 7/1998 Targetti ....................... 362/362
5,996,728 A * 12/1999 Stark .......................... 181/144

(Continued)

FOREIGN PATENT DOCUMENTS

EP 1523214 A2 * 4/2005

OTHER PUBLICATIONS

"Plastic Stacking corner", "Plastic stacking corner ribbed", "metal cabinet corner large stackable black" and "metal cabinet corner large stackable zinc", http://www.partsexpress.com; 4 pages.*

(Continued)

*Primary Examiner*—Edgardo San Martin
(74) *Attorney, Agent, or Firm*—Withers & Keys, LLC

(57) ABSTRACT

A speaker cabinet design for providing adjustability of the number of speaker cabinets contained in a speaker array comprises female connectors (50) along the front and back edges on the top and right sides. A user of the cabinet can attach a mating second cabinet to any side of the first cabinet by inserting male connector (40) in the pass through assembly and securing to the female connector at all locations on that side. A user can connect a second speaker cabinet in a series or parallel electrical connection. This allows the user to build up to the desired number of speakers without purchasing a full speaker array. Furthermore, once the desired array is complete the user can remove only the number needed for transport. A variety of different speakers can be preloaded in the cabinet at the factory, thus giving the user flexibility in sound without having to remove and install different speakers.

11 Claims, 6 Drawing Sheets

U.S. PATENT DOCUMENTS

| | | | | |
|---|---|---|---|---|
| 6,009,182 | A * | 12/1999 | Gunness | 381/182 |
| 6,640,924 | B2 * | 11/2003 | Messner | 181/144 |
| 6,801,631 | B1 * | 10/2004 | North | 381/336 |
| D499,085 | S * | 11/2004 | Baird et al. | D14/215 |
| 2004/0069561 | A1 * | 4/2004 | Cox et al. | 181/199 |
| 2005/0123165 | A1 * | 6/2005 | Yang | 381/386 |

OTHER PUBLICATIONS

"Ibanez Toneblaster TB412A 4×12 Inch Angled guitar cabinet", http://shopping.msn.com; 1 page.*

"Ibanez TB100H Tone Blaster Full Stack Package", http://www.musiciansfriend.com; 3 pages.*

Celestion, 4×12" Stereo Monitoring, http://professional.celestion.com/guitar/features/drdecibel/index.asp, circuit shown believed to have been public prior to Jul. 11, 2002.

* cited by examiner

MODULAR SPEAKER CABINET

CROSS-REFERENCE TO RELATED APPLICATIONS

This application claims the benefit of U.S. Provisional Patent Application Ser. No. 60/395,224 filed 2002 Jul. 11.

STATEMENT REGARDING FEDERALLY SPONSORED RESEARCH OR DEVELOPMENT

Not Applicable

REFERENCE TO SEQUENCE LISTING, A TABLE, OR A COMPUTER PROGRAM LISTING COMPACT DISK APPENDIX

Not Applicable

BACKGROUND OF THE INVENTION

This invention relates to speaker cabinets, specifically to speaker cabinets used for instrument amplification. The largest typical speaker cabinet used with guitar amplifiers contains four speakers. Most amplifiers are designed to work with two, four speaker cabinets and many musicians try to obtain this configuration to perform with. However, a four speaker cabinet is expensive and not very versatile. All four speakers in the cabinet are the same and come preloaded from the factory. A problem also arises when the user would like to go practice and has to contend with moving a heavy four speaker cabinet or resorts to buying a separate combination amplifier.

BRIEF SUMMARY OF THE INVENTION

The invention, a modular speaker cabinet, has connectors to attach individual speaker cabinets together. These connectors, a male and a female, are opposite one another on each cabinet and are provided to adjust the number of speakers contained within an array. The female connector is secured to the cabinet at all times while the male connector is used only where needed. Access to some connections in the rear of the cabinet is obtained through the rear door which can be removed for open back operation.

Accordingly several objects and advantages of the invention are to provide means for adjustment of the number and type of speakers contained within an array of speakers and provide a more economical means of obtaining a larger speaker array. Still further objects and advantages will become apparent from a study of the description and the accompanying drawings.

REFERENCE NUMERALS

Figure 1:
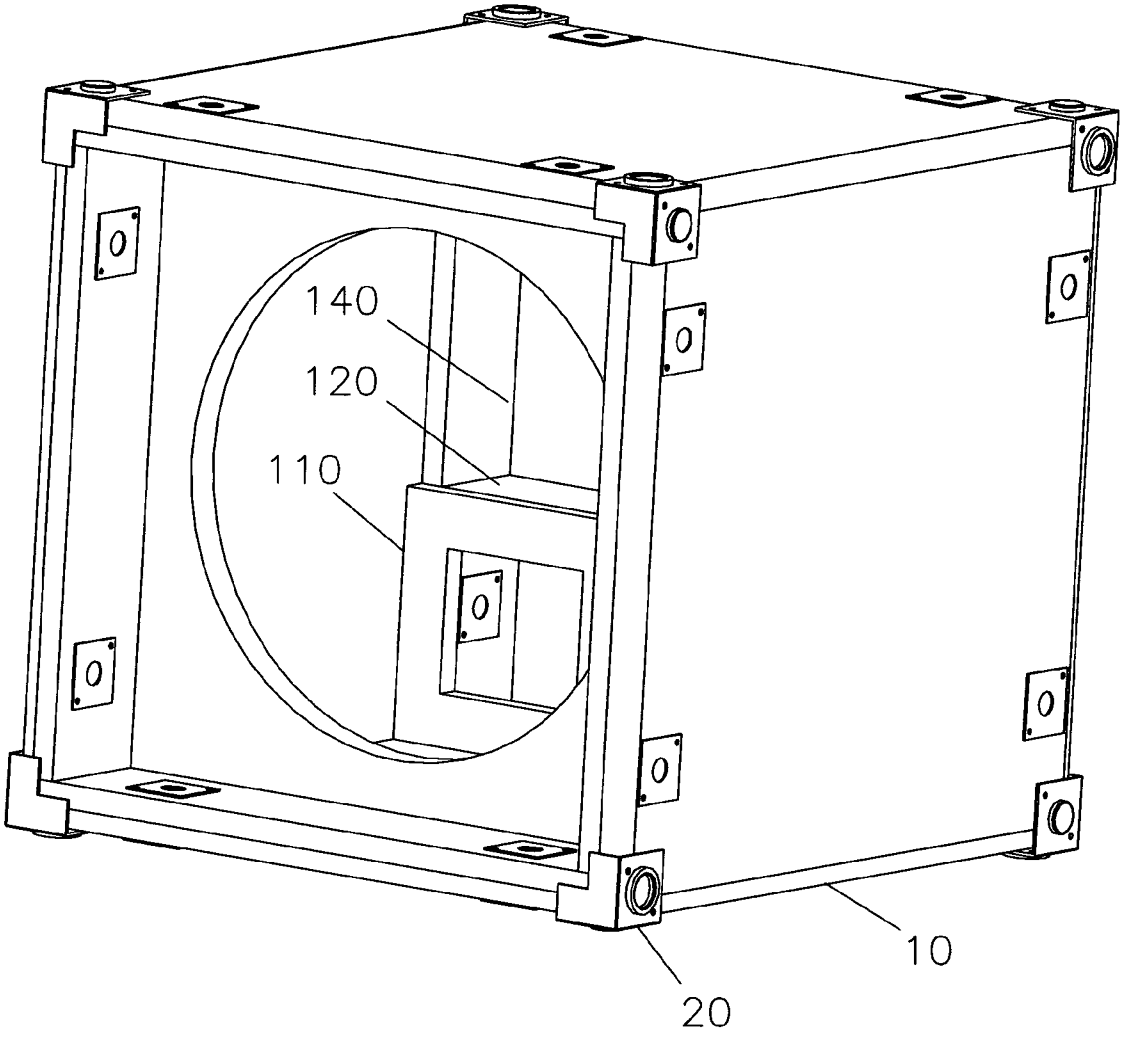
FIG. 1 is a perspective front right-side view of a single speaker cabinet showing the front, side and top of the cabinet.

10 base cabinet
20 stacking corner
30 pass through plate
40 male connector
50 female connector
60 cover plate
70 rear door
80 latch
90 lift off hinge
100 notched closeout
110 back panel
120 middle back divider
130 jack dish
140 air seal
150 catch

DETAILED DESCRIPTION OF THE INVENTION

Figure 6:
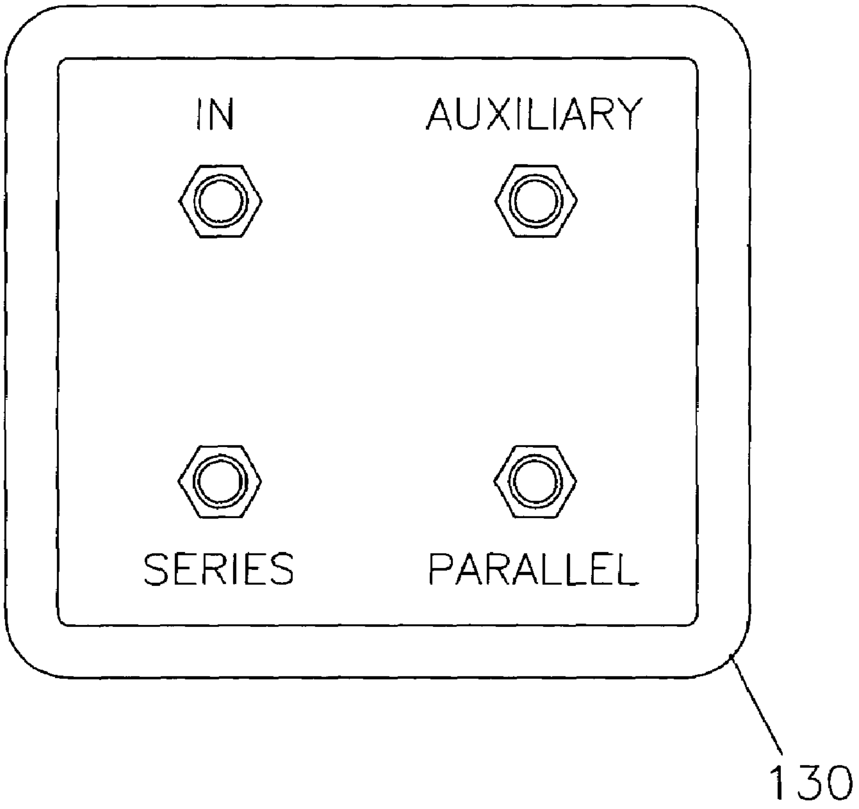
FIG. 6 is a plan view of a jack dish installed in the rear cutout of the cabinet in FIG. 3.

FIG. 1 is a perspective view of a base cabinet 10 constructed in a conventional fashion and in accordance with the invention. A stacking corner 20 attaches to each corner of base cabinet 10. Back panel 110 spans the inside width of base cabinet 10 and has a hole located to one side for a jack dish 130 (FIG. 6). Back panel 110 is recessed and attached to the lower back portion of base cabinet 10. A middle back divider 120 spans the inside edge width of base cabinet 10 and aligns with the top of back panel 110. Middle back divider 120 attaches to the back edges of base cabinet 10. An air seal 140 is attached to base cabinet 10 edges and middle back divider 120. Four holes are made in the top, bottom, left and right sides of base cabinet 10 at the front and back edges. Conventional recessed handles (not shown) are centered on the left and right sides of base cabinet 10.

Figure 2:
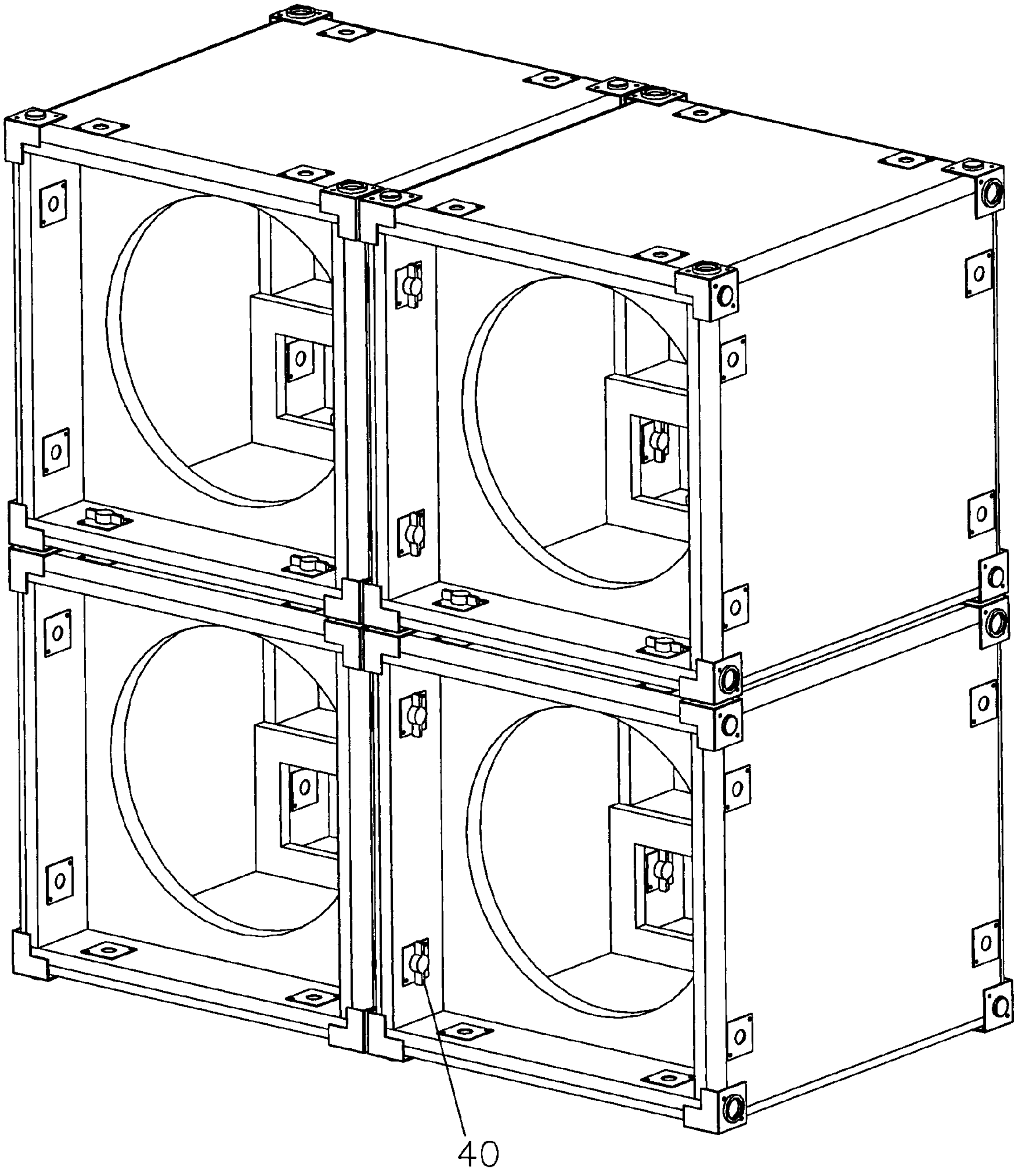
FIG. 2 is a perspective front right-side view of an array of four single speaker cabinets.

FIG. 2 is a perspective front right-side view of a four single speaker cabinet array used to show typical four single cabinet assembly. Male connector 40 is shown in assembled position.

Figure 3:
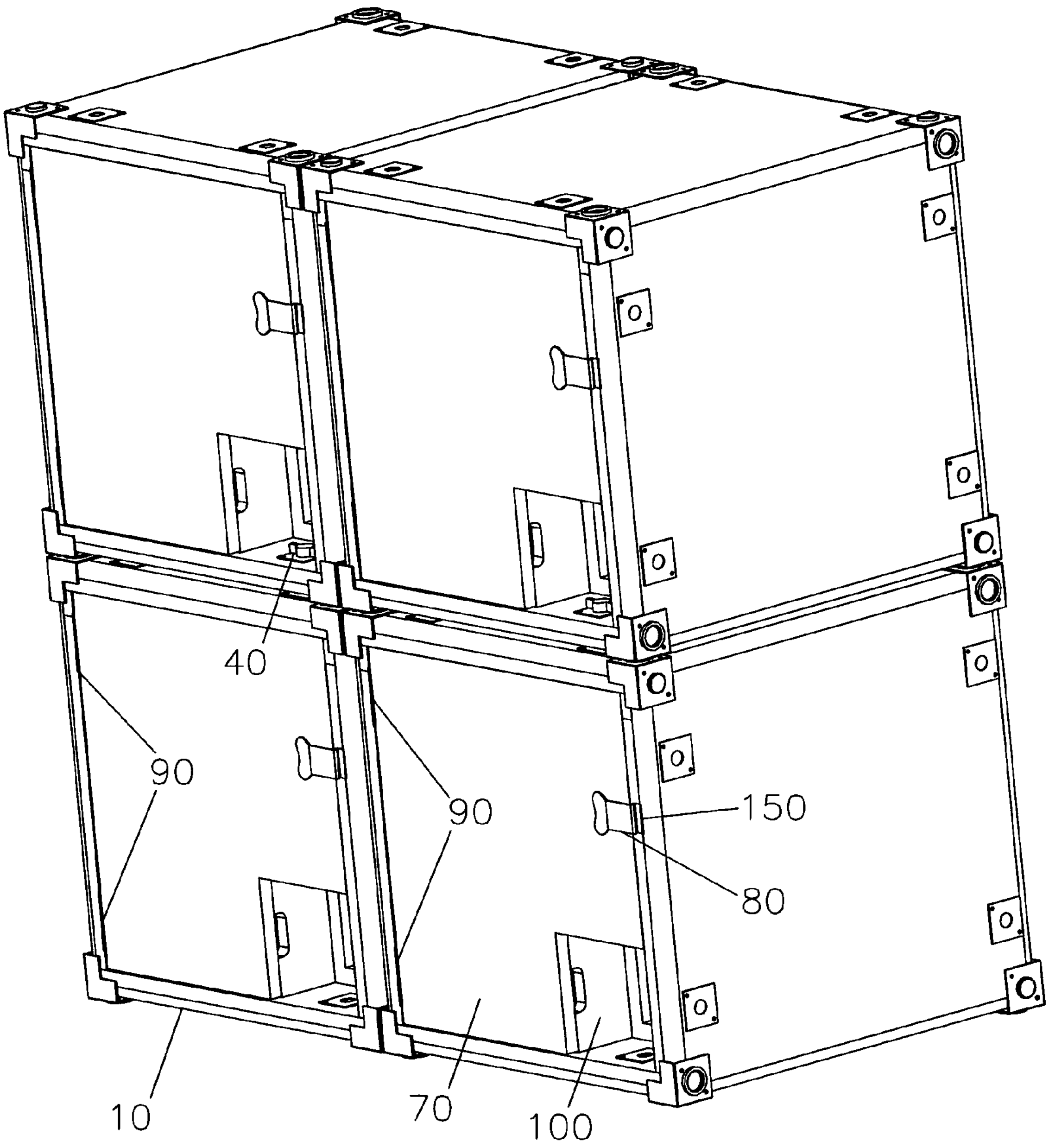
FIG. 3 is a perspective rear left-side view of the array in FIG. 2

FIG. 3 is a perspective rear left-side view of the four speaker array attached together. A lift off hinge 90 is attached to base cabinet 10 and a rear door 70 at two locations along the side of the base cabinet 10 opposite jack dish 130 (FIG. 6). A latch 80 attached to rear door 70 and a catch 150 attached to base cabinet 10 work in conjunction, opposite the hinges. A notched closeout 100 is attached to the rear bottom edge of base cabinet 10, the bottom of middle back divider 120 (FIG. 1), and the rear of back panel 110 (FIG. 1) to form a storage area enclosed by rear door 70.

Figure 4:
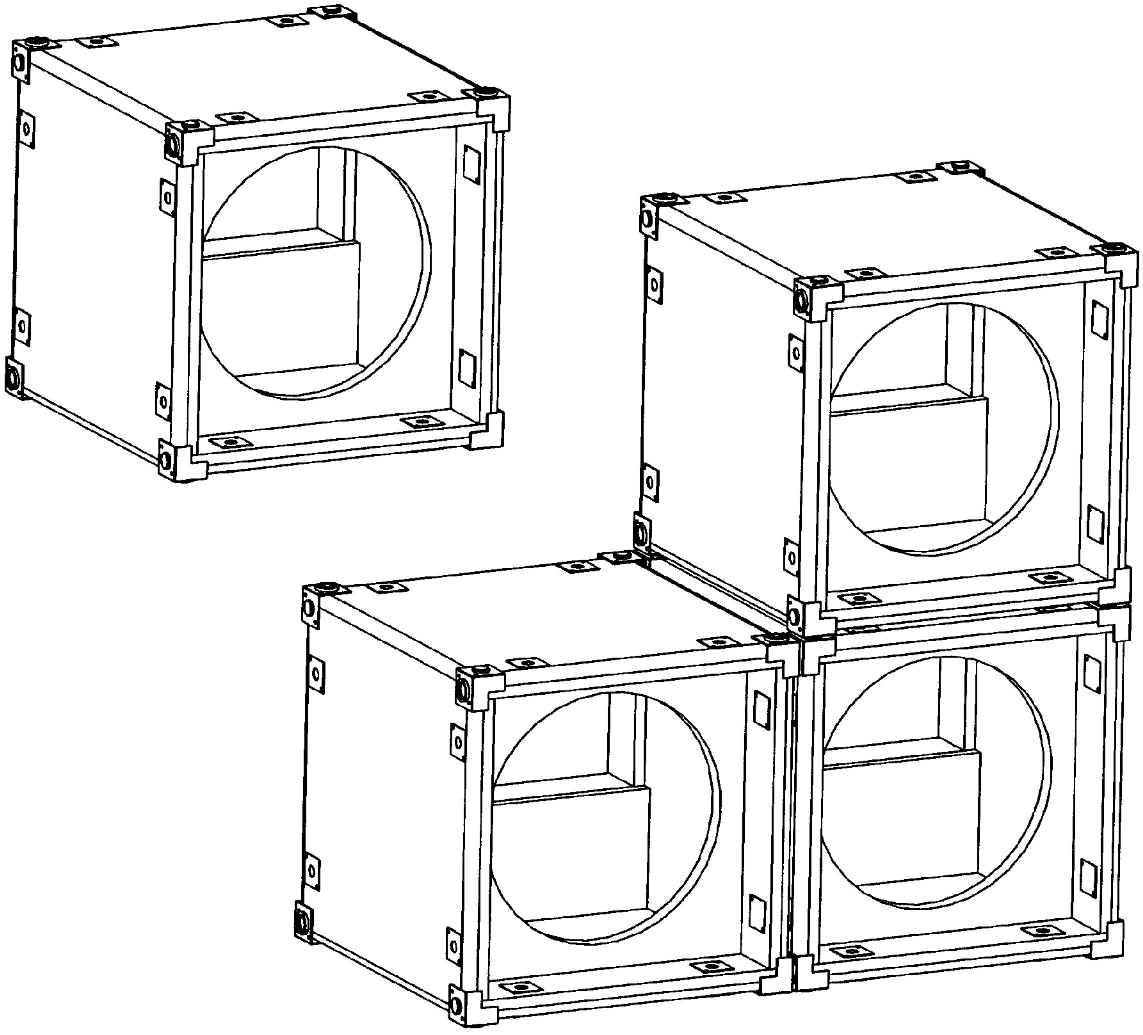
FIG. 4 is a perspective front left-side view of the array in FIG. 2 with one cabinet detached.

FIG. 4 is a perspective front left-side view of the four speaker array to show detachment of a single speaker cabinet.

Figure 5:
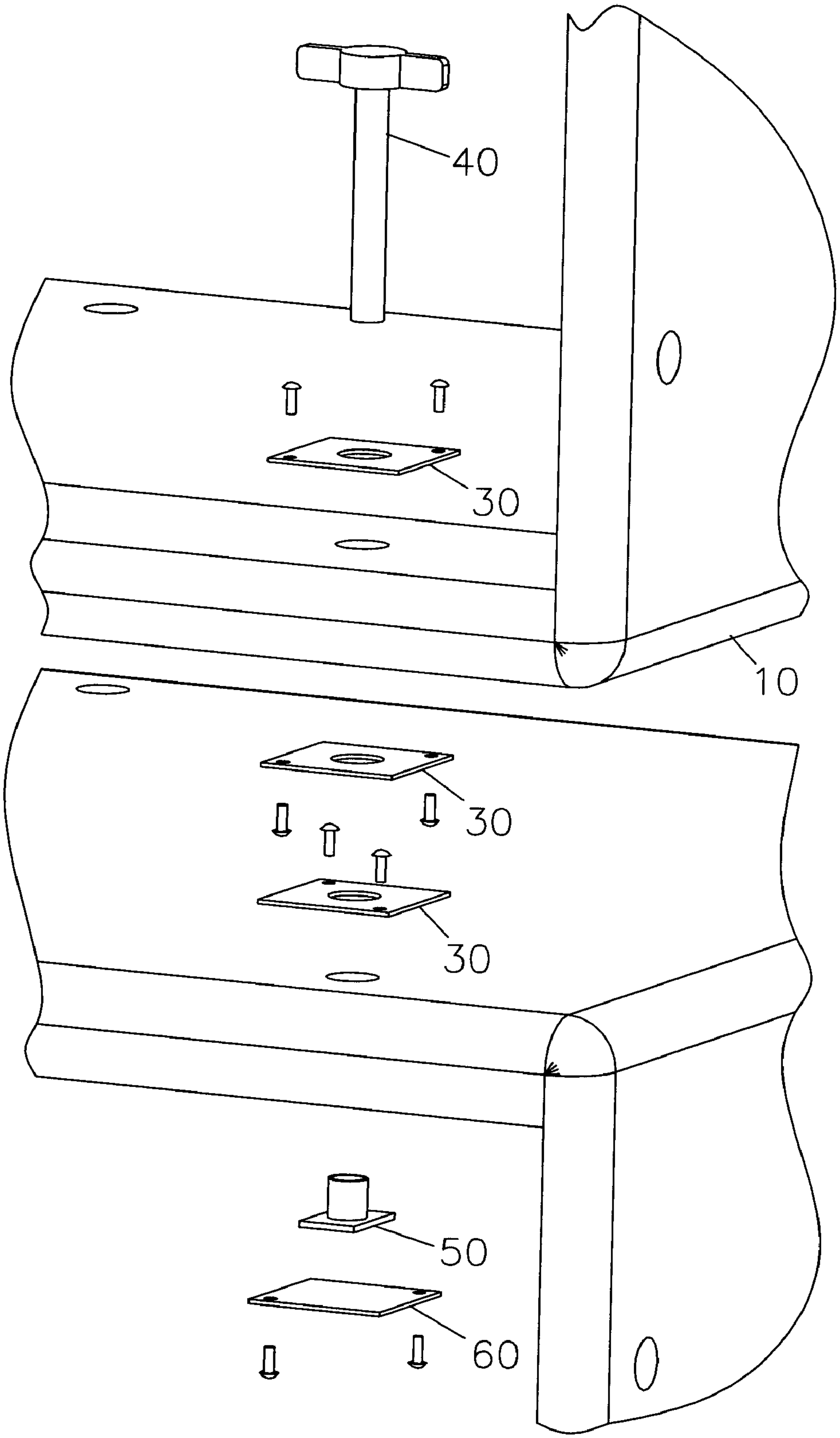
FIG. 5 is an exploded assembly of connection hardware of the perspective front right-side view of the array in FIG. 2.

FIG. 5 is an exploded assembly of a connection assembly in perspective. The connection assembly is divided into two subassemblies, a pass through assembly and a base assembly. The pass through assembly consists of two pass through plates 30 and male connector 40. Pass through plates 30 are centered on the holes located on the bottom and left side of base cabinet 10 at the front and back edge. The base assembly consists of pass through plate 30, a cover plate 60, and a female connector 50. The connection assembly is centered on the holes located on the top and right side of base cabinet 10 at the front and back edge. A recessed on the inside edge of the hole locations to accept the female connector 50 and allow cover plate 60 to mount flush.

FIG. 6 is a plan view to jack dish 130. Jack dish 130 is located in the hole in back panel 110 (FIG. 1) with the flange of jack plate 130 attached flush to the back of back panel 110.

Figure 7:
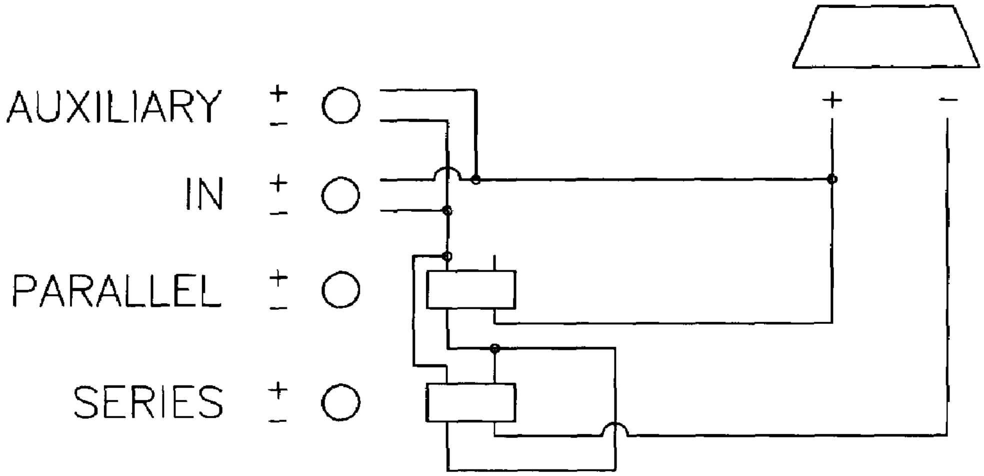
FIG. 7 is a wiring schematic of an electrical connection to a single speaker.

FIG. 7 is a schematic of the wiring for a single speaker cabinet. Two standard jacks and two mono switch jacks are used. The mono switch jacks are used for the parallel and series connections and the standard jacks for the auxiliary and input connections.

In operation one uses the cabinet in a normal manner with a source signal from an amplifier. The user can attach mating cabinets to one another by aligning the cabinet holes and securing male connector 40 bearing on one cabinet to female connector 50 bearing on the opposite cabinet (FIGS. 2 and 5). Access to back male connectors 40 is gained by opening rear door 70. The user can operate in open back mode by unlatching latch 80, opening rear door 70, and lifting rear door 70 off lift off hinges 90.

The user can electrically connect multiple speaker cabinets in either parallel or series by use of the appropriate jacks at the cabinet rear. Signal input comes through the in jack. The following speaker in the signal chain has its in jack connected to the parallel or auxiliary jack of the previous speaker cabinet for parallel connection and to the series jack for series connection. In transport the user can place all hardware and cables in the storage area in the cabinet back accessed by cabinet rear door 70.

There are many possibilities with regard to type of male and female connectors that are applicable. The preferred embodiment shown is a conventional cap screw with a tee head as male connector 40, and a conventional slab base weld nut as female connector 50. The connectors could alternately be switched to have a female type receptacle pass through the cabinet holes and attach to a male connector. Alternately a conventional quarter turn type fastening system can be used. There are also alternate possibilities with regard to rear door 70. Rear door 70 can be eliminated and operated as open back only. Rear door 70 can also be permanently attached to the cabinet and all connection assemblies located to the exterior of the cabinet interior. The side of base cabinet 10 can bear directly on the side of an adjoining base cabinet 10 by removing stacking corners 20 and exterior mounted pass through plates 30. Another embodiment of the electrical connection is the use of three jacks and a conventional switch to change one of the three jacks from parallel to series. The other two jacks would be for input and parallel connection. A single input jack could be used for parallel electrical connection at the detriment of versatility.

The invention claimed is:

1. A speaker cabinet, comprising:

a base cabinet which houses at least one speaker with at least one connection hole in one of the four sides and at least one connection hole in a side that is perpendicular to the one side, at least one female connector centered on the at least one connection hole in the one side and at least one female connector centered on the at least one connection hole in the side that is perpendicular to the one side, at least one male connector which passes through either the at least one connection hole in the one side or the at least one connection hole in the side that is perpendicular to the one side and attaches to the female connector of either the at least one connection hole in the one side or the at least one connection hole in the side that is perpendicular to the one side, whereby (a) a user of said speaker cabinet can secure a mating speaker cabinet in bearing to the first cabinet with said male connector and either female connector and thereby increase the number of speakers in a speaker array, and (b) said user can remove one or more speakers in the speaker array, an input jack having first and second connections;

a speaker connection having first and second connections, the first connection of the speaker connection being connected to the first connection of the input jack;

a series output switching jack having first, second, third, fourth, fifth, and sixth connections, the fourth connection of the series output switching jack being connected to the second connection of the speaker connection, the first connection of the series output switching jack being connected to the second connection of the input jack, the second connection of the series output switching jack being connected to the third connection of the series output switching jack, wherein when a plug is not inserted into the jack the first connection of the series output switching jack is connected to the third connection of the series output switching jack while the second connection of the series output switching jack is connected to the fourth connection of the series output switching jack, and wherein when a plug is inserted into the jack the first connection of the series output switching jack is no longer connected to the third connection of the series output switching and the second connection of the series output switching jack is no longer connected to the fourth connection of the series output switching act while the third connection of the series output switching jack is connected to the sixth connection of the series output switching jack and while the fourth connection of the series output switching jack is connected to the fifth connection of the series output switching jack; and a parallel output switching jack having first, second, third, fourth, fifth, and sixth connections, the first connection of the parallel output switching jack being connected to second connection of the input jack, the third connection of the parallel output switching jack being connected to the second connection of the series output switching jack and to the third connection of the series output switching jack, the fourth connection of the parallel output switching jack being connected to the second connection of the speaker connection, when a plug is not inserted into the jack the first connection of the series output switching jack is connected to the third connection of the series output switching jack while the second connection of the series output switching jack is connected to the fourth connection of the series output switching jack, and wherein when a plug is inserted into the jack the first connection of the parallel output switching jack is no longer connected to the third connection of the parallel output switching and the second connection of the parallel output switching jack is no longer connected to the fourth connection of the parallel output switching act while the third connection of the parallel output switching jack is connected to the sixth connection of the parallel output switching jack and while the fourth connection of the parallel output switching jack is connected to the fifth connection of the parallel output switching jack, wherein the plug being inserted into the series output switching jack places the speaker connection in series with series output switching jack relative to the input switching jack while breaking an electrical circuit between the fifth and sixth connections of the parallel output switching jack and the input jack and wherein the plug being inserted into the parallel output switching jack places the speaker connection in parallel with the parallel output switching jack relative to the input switching jack while breaking an electrical circuit between the fifth and sixth connections of the series output switching jack and the input jack.

2. The base cabinet of claim 1 further including a stacking corner to align connection holes in a plurality of said base cabinets.

3. The base cabinet of claim 1 wherein said cabinet is used to amplify a musical instrument.

4. The base cabinet of claim 1 wherein said one side and said side perpendicular to the one side of said base cabinet comprise four said connection holes.

5. The base cabinet of claim 1 wherein said male connector is a cap screw.

6. The base cabinet of claim 1 wherein said female connector is a slab base weld nut.

7. The base cabinet of claim 1 wherein said male connector and female connector are conventional quarter turn fasteners.

8. The base cabinet of claim 1 further including a pass through plate centered on said connection hole at the male connector to base cabinet interface.

9. The base cabinet of claim 1, wherein the at least one female connector is located at an area on the side that is separated from an enclosed area.

10. The base cabinet of claim 9, wherein the female connector is capped on one side, wherein the capped side is exposed to the ambient.

11. A speaker cabinet system, comprising:

a plurality of mated cabinets each containing a speaker, wherein a bottom of a first cabinet is mated to a top of a second cabinet, and wherein a side of a third cabinet is mated to a side of the second cabinet, wherein each cabinet comprises:

an input jack;

a speaker connection;

a series output switching jack;

a parallel output switching jack, wherein an electrical plug being inserted into the series output switching jack causes the series output switching jack to change from a first switched state to a second switched state to thereby place the speaker connection in series with the series output switching jack relative to the input switching jack and wherein the plug being inserted into the parallel output switching jack causes the parallel output switching jack to change from a first switched state to a second switched state to place the speaker connection in parallel with the parallel output switching jack relative to the input switching jack.

* * * * *